United States Patent
Wang et al.

(10) Patent No.: US 10,431,584 B2
(45) Date of Patent: *Oct. 1, 2019

(54) SEMICONDUCTOR DEVICE INCLUDING FIN STRUCTURES AND MANUFACTURING METHOD THEREOF

(71) Applicant: TAIWAN SEMICONDUCTOR MANUFACTURING CO., LTD., Hsinchu (TW)

(72) Inventors: Sheng-chen Wang, Hsinchu (TW); Sai-Hooi Yeong, Hsinchu County (TW); Tsung-Chieh Hsiao, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/839,286

(22) Filed: Dec. 12, 2017

(65) Prior Publication Data
US 2018/0114790 A1     Apr. 26, 2018

Related U.S. Application Data

(60) Continuation of application No. 15/285,058, filed on Oct. 4, 2016, now Pat. No. 9,871,038, which is a (Continued)

(51) Int. Cl.
   *H01L 29/76*           (2006.01)
   *H01L 29/94*           (2006.01)
   (Continued)

(52) U.S. Cl.
CPC .... *H01L 27/0886* (2013.01); *H01L 21/76224* (2013.01); *H01L 21/823431* (2013.01);
(Continued)

(58) Field of Classification Search
CPC ...................... H01L 21/76224; H01L 29/1054
(Continued)

(56) References Cited

U.S. PATENT DOCUMENTS 7,425,740 B2    9/2008   Liu et al.
8,048,723 B2   11/2011   Chang et al.
(Continued)

FOREIGN PATENT DOCUMENTS

KR    10-2014-0127725 A    11/2014
TW        201113984 A     4/2011

OTHER PUBLICATIONS

Notice of Allowance U.S. Appl. No. 14/846,404 dated Jun. 22, 2016.
(Continued)

*Primary Examiner* — Theresa T Doan
(74) *Attorney, Agent, or Firm* — McDermott Will & Emery LLP

(57) ABSTRACT

A semiconductor device includes device areas where a Fin FET is disposed and a non-device area disposed between the device areas, which includes a dummy structure. The Fin FET includes a fin structure having a well region including a first semiconductor layer, a stressor region including a second semiconductor layer and a channel region including a third semiconductor layer; an isolation region in which the well region is embedded, and from which at least an upper port of the channel region is exposed; a gate structure disposed over a part of the fin structure. The dummy structure in the non-device area includes a first dummy layer formed over the first semiconductor layer and made of a different material from the stressor region, and a second dummy layer formed over the first dummy layer and made of a different material from the channel region.

20 Claims, 6 Drawing Sheets

Related U.S. Application Data division of application No. 14/846,404, filed on Sep. 4, 2015, now Pat. No. 9,472,620.

(51) Int. Cl.

| | | |
|---|---|---|
| *H01L 27/088* | (2006.01) | |
| *H01L 29/10* | (2006.01) | |
| *H01L 29/78* | (2006.01) | |
| *H01L 29/06* | (2006.01) | |
| *H01L 29/16* | (2006.01) | |
| *H01L 29/66* | (2006.01) | |
| *H01L 21/762* | (2006.01) | |
| *H01L 21/8234* | (2006.01) | |
| *H01L 29/161* | (2006.01) | |

(52) U.S. Cl.
CPC .. *H01L 21/823481* (2013.01); *H01L 29/0653* (2013.01); *H01L 29/1054* (2013.01); *H01L 29/16* (2013.01); *H01L 29/161* (2013.01); *H01L 29/6681* (2013.01); *H01L 29/7851* (2013.01)

(58) Field of Classification Search
USPC .......................................... 257/401; 438/284
See application file for complete search history.

(56) References Cited

U.S. PATENT DOCUMENTS

| | | | |
|---|---|---|---|
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wenn et al. | |
| 8,618,556 B2 | 12/2013 | Wu et al. | |
| 8,633,516 B1 | 1/2014 | Wu et al. | |
| 8,637,359 B2 | 1/2014 | Chang et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 9,006,842 B2 | 4/2015 | Colinge et al. | |
| 9,099,570 B2 | 8/2015 | Loubet et al. | |
| 9,871,038 B2* | 1/2018 | Wang | H01L 29/1054 |
| 2010/0164051 A1 | 7/2010 | Chae et al. | |
| 2011/0079836 A1 | 4/2011 | Lin | |
| 2013/0049121 A1 | 2/2013 | Baldauf et al. | |
| 2013/0270620 A1* | 10/2013 | Hu | H01L 21/76229 257/296 |
| 2013/0285153 A1 | 10/2013 | Lee et al. | |
| 2013/0309839 A1 | 11/2013 | Wilson et al. | |
| 2014/0011341 A1* | 1/2014 | Maszara | H01L 29/66795 438/478 |
| 2014/0183600 A1 | 7/2014 | Huang et al. | |
| 2014/0264590 A1 | 9/2014 | Yu et al. | |
| 2014/0264592 A1 | 9/2014 | Oxland et al. | |
| 2014/0322882 A1 | 10/2014 | Rodder et al. | |
| 2015/0008483 A1 | 1/2015 | Ching et al. | |
| 2015/0069474 A1 | 3/2015 | Ching et al. | |

OTHER PUBLICATIONS

Office Action Taiwanese Patent Application No. 104139593 dated Dec. 30, 2016.
Notice of Allowance issued in U.S. Appl. No. 15/285,058 dated Oct. 4, 2016.
Office Action issued in U.S. Appl. No. 15/285,058 dated May 19, 2017.

* cited by examiner

SEMICONDUCTOR DEVICE INCLUDING FIN STRUCTURES AND MANUFACTURING METHOD THEREOF

RELATED APPLICATIONS

This application is a Continuation of a U.S. patent application Ser. No. 15/285,058 filed on Oct. 4, 2016, which is a Division of U.S. patent application Ser. No. 14/846,404 filed on Sep. 4, 2015, the disclosures of which Application are incorporated by reference herein.

TECHNICAL FIELD

The disclosure relates to a semiconductor integrated circuit, and more particularly to a semiconductor device having a fin structure and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices. In Fin FET devices, the upper portion of the fin structure functions as a channel, while the lower portion of the fin structure functions as a well. In addition, strained materials in source/drain (S/D) portions of the Fin FET utilizing selectively grown silicon germanium (SiGe) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
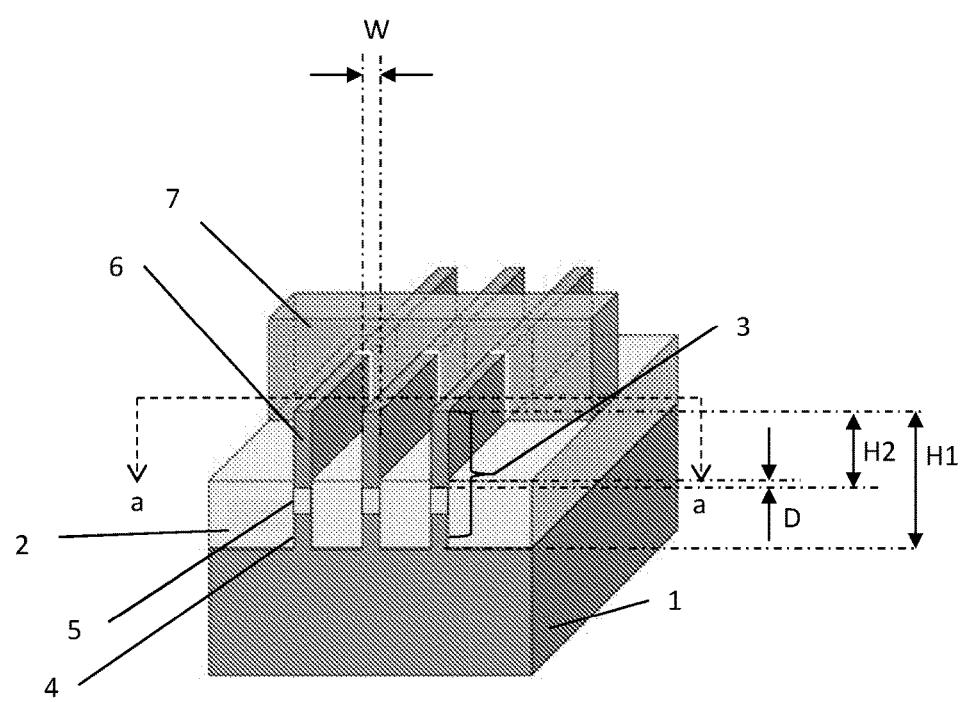
FIG. 1 is an exemplary cross sectional view of a Fin FET device according to one embodiment of the present disclosure.

FIG. 1 is an exemplary cross sectional view of a Fin FET device according to one embodiment of the present disclosure.

The Fin FET device includes, among other features, a substrate 1, an isolation layer 2, fin structures 3 and a gate structure 7.

The fin structures 3 are disposed over the substrate 1. Each of the fin structures 3 includes a well region 4, a stressor region 5 and a channel region 6. The stressor region 5 applies an appropriate stress (tensile or compressive) to the channel region 6.

The well region 4 of the fin structure 3 is made of the same material as the substrate 1 and continuously extends from the substrate 1. In other embodiments, the well region is formed over the substrate 1.

In FIG. 1, three fin structures 3 are disposed over the substrate 1. However, the number of the fin structures is not limited to three. The numbers may be as small as one, or more than three. In addition, one of more dummy fin structures may be disposed adjacent both sides of the fin structures 3 to improve pattern fidelity in patterning processes. The width W of the fin structure 3 is in a range from about 5 nm to 50 nm in some embodiments, or is in a range from about 5 nm to 20 nm in other embodiments. The height H1 of the fin structure 3 is in a range from about 100 nm to about 300 nm in some embodiments, and is in a range from about 50 nm to 100 nm in other embodiments.

The spaces between the fin structures 3 and/or a space between one fin structure and another element formed over the substrate 1 are filled by an isolation insulating layer 2 (or so-called a "shallow-trench-isolation (STI)" layer) including an insulating material.

The lower part of the fin structure 3 under the gate structure 7 is referred to as a well region 4, and the upper part of the fin structure 3 is referred to as a channel region 6. In one embodiment of the present disclosure, the fin structure 3 further includes a stressor region 5 between the well region 4 and the channel region 6. Under the gate structure 7, the well region 4 and the stressor region 5 are embedded in an isolation insulating layer 2, and the channel region 6 protrudes from the isolation insulating layer 2. A lower part of the channel region 6 may also be embedded in the isolation insulating layer 2 to a depth D of about 1 nm to about 5 nm. The height H2 of the channel region 6 is in a range from about 20 nm to 100 nm in some embodiments, or is in a range from about 30 nm to about 60 nm in other embodiments.

The channel region 6 protruding from the isolation insulating layer 2 is covered by a gate structure including a gate dielectric layer covered by a gate electrode (not shown). Part of the channel region 6 not covered by the gate structure 7 functions as a source and/or drain of the MOS FET.

Source and drain regions are formed in the channel region 6 not covered by the gate structure 7, by appropriately doping impurities in the source and drain regions. An alloy of Si or Ge and a metal such as Co, Ni, W, Ti or Ta may be formed on the source and drain regions.

Further, the gate structure 7 and the source/drain regions are covered by an interlayer insulating film (not shown), and necessary wirings and/or via/contact holes are disposed so as to complete the semiconductor device.

FIGS. 2-9 show exemplary cross sectional views illustrating sequential processes for manufacturing the Fin FET device according to one embodiment of the present disclosure. FIGS. 2-9 are cross sectional views corresponding line a-a shown in FIG. 1, except for the number of fin structures. It is understood that additional operations can be provided before, during, and after processes shown by FIGS. 2-9, and some of the operations described below can be replaced or eliminated, for additional embodiments of the method. The order of the operations/processes can be interchangeable.

Figure 2:
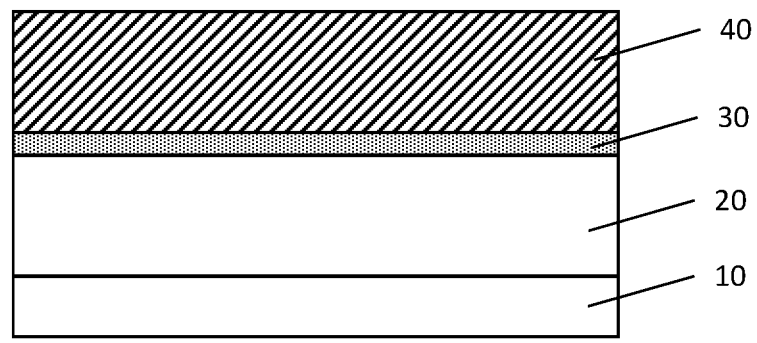
FIGS. 2-9 show exemplary cross sectional views illustrating sequential processes for manufacturing the Fin FET device according to one embodiment of the present disclosure.

FIG. 2 is an exemplary cross sectional view of one of the manufacturing states for a semiconductor FET device having a fin structure (Fin FET).

In FIG. 2, a first semiconductor layer 20 is formed over a substrate 10. In one embodiment of the present disclosure, the first semiconductor layer 20 includes $Si_{1-x}Ge_x$, where x is 0.1 to 0.9, or in some embodiments, x is in a range from about 0.4 to about 0.9. In this disclosure, $Si_{1-x}Ge_x$ may be simply referred to as SiGe.

The substrate 10 is, for example, a p-type silicon substrate with an impurity concentration in a range from about $1 \times 10^{15}$ $cm^{-3}$ and about $5 \times 10^{15}$ $cm^{-3}$. In other embodiments, the substrate 10 may be an n-type silicon substrate with an impurity concentration in a range from about $1 \times 10^{15}$ $cm^{-3}$ and about $5 \times 10^{15}$ $cm^{-3}$.

Alternatively, the substrate 10 may comprise another elementary semiconductor, such as germanium; a compound semiconductor including IV-IV compound semiconductors such as SiC and SiCGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. The substrate 10 may include various regions that have been suitably doped with impurities (e.g., p-type or n-type conductivity).

The SiGe first semiconductor layer 20 is epitaxially grown over the Si substrate 10. To suppress dislocations or other defects, the Ge content (x) in the SiGe first semiconductor layer is in a range about 0.15 to 0.3 in some embodiments. The thickness of the first semiconductor layer is in a range from about 500 nm to 2000 nm in some embodiments, or is in a range from about 1000 nm to about 1500 nm in other embodiments. The SiGe first semiconductor layer 20 is appropriately doped with impurities. The impurities may be introduced during the epitaxial growth or by using an ion implantation method after growing the first semiconductor layer. The dopants are, for example boron ($BF_2$) for an n-type Fin FET and phosphorus for a p-type Fin FET. The SiGe first semiconductor layer 20 will become a well region of the Fin FET.

If the substrate 10 is made of SiGe, the first semiconductor layer 20 may be an upper portion of the SiGe substrate.

As shown in FIG. 2, an etching stop layer 30 is formed over the SiGe first semiconductor layer 20. Further, a dummy layer 40 is formed over the etching stop layer 30.

Figure 3:
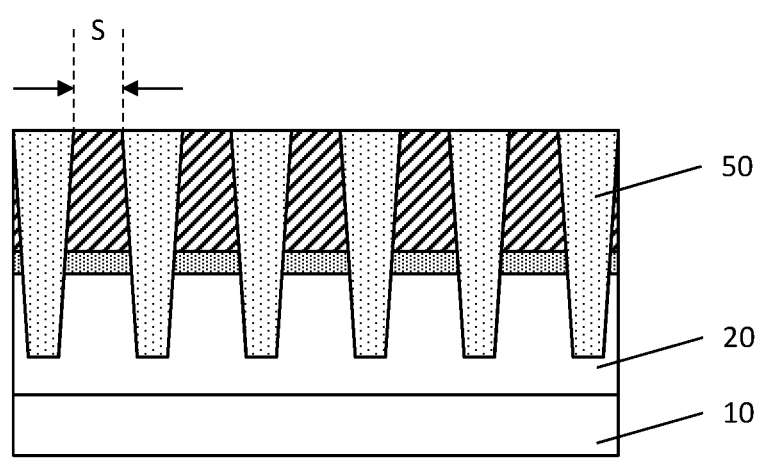

The etching stop layer 30 is made of a material having a sufficient etching selectivity (e.g., 10 or more) against the dummy layer 40 and an isolation layer 50 (see, FIG. 3). The etching stop layer 30 is made of one or more layers of insulating material. In one embodiment of the present disclosure, the etching stop layer 30 includes SiN, SiON, SiCN or SiOCN. In some embodiments, the etching stop layer 30 may include silicon oxide. The thickness of the etching stop layer 30 is in a range from about 2 nm to 20 nm in some embodiments, or is in a range from about 5 nm to about 10 nm in other embodiments. In other embodiments, the etching stop layer 30 may include conductive material or semiconductor material such as Ge.

The etching stop layer 30 can be formed by a physical vapor deposition (PVD), such as a sputtering method, a chemical vapor deposition (CVD), plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The dummy layer 40 is made of a material having a sufficient etching selectivity (e.g., 10 or more) against the etching stop layer 30 and the isolation layer 50. In one embodiment, the dummy layer 40 is made of Si or a Si based compound. When Si is used, the Si dummy layer 40 is a polycrystalline Si layer or an amorphous Si layer. Depending on the material of the etching stop layer 30, the Si dummy layer can be a crystal Si. In other embodiments, the dummy layer 40 is made of other semiconductor material such as SiGe or Ge, or an insulating material such as oxide or nitride. The dummy layer 40 may be made of a metal material or a metal compound such as Ti, Ta, TiN and TaN. The thickness of the dummy layer 40 is in a range from about 20 nm to 100 nm in some embodiments, or is in a range from about 30 nm to about 60 nm in other embodiments.

The dummy layer 40 may be formed by PVD, PECVD, APCVD, LPCVD, HDPCVD, and/or ALD, and/or other processes.

As shown in FIG. 3, isolation layers 50 are formed. In one embodiment, the isolation layer 50 is a shallow trench isolation (STI) layer.

To form the STI layer 50, a resist pattern is formed over the dummy layer 40 by using a lithography operation. Then, by using the resist pattern as an etching mask, a patterning operation is performed to form trenches in the dummy layer 40, the etching stop layer 30 and the first semiconductor layer 20. The trenches may reach the substrate 10 in some embodiments. The space S between the adjacent trenches, which will define the channel width of the Fin FET, is in a range from about 5 nm to 50 nm in some embodiments, or is in a range from about 5 nm to 20 nm in other embodiments. The trenches generally have a tapered shape with a smaller bottom and a larger upper portion.

After forming the tranches, the trenches are filled with one or more layers of insulating material. The insulating material includes, for example, silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydropolysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, for example, in a range from about 300° C. to about 800° C., or in a range from about 300° C. to about 500° C. The insulating material may include SOG, SiO, SiON, SiOCN or fluoride-doped silicate glass (FSG) in some embodiments.

The insulting material is formed in the trenches as well as on the upper surface of the dummy layer 40. A planarization operation such as a chemical mechanical polishing (CMP) method and/or an etch-back process is performed so as to obtain the STI layer 50 as shown in FIG. 3.

Figure 4:
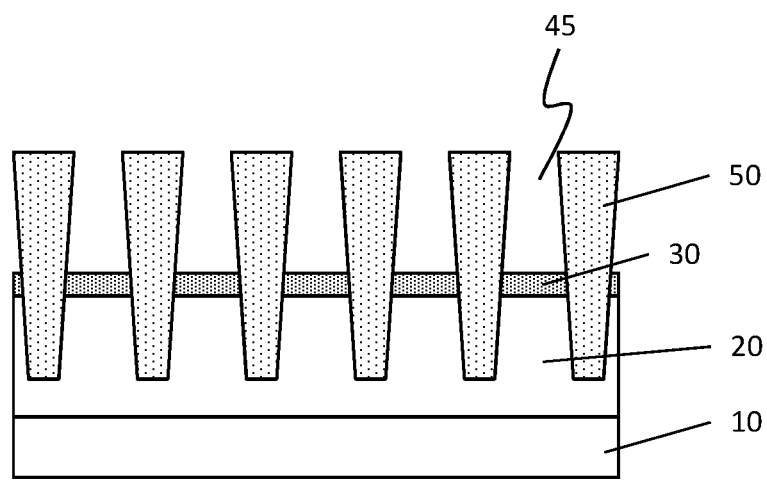

Next, as shown in FIG. 4, the dummy layers 40 between the STI layers 50 are removed to form spaces 45. Dry etching and/or wet etching is applied to remove the dummy layers 40. Since the etching stop layer 30 is formed in the bottom of the dummy layers 40, an appropriate over etching can be performed so that substantially no dummy layers remain on the surface of the etching stop layer 30.

Figure 5:
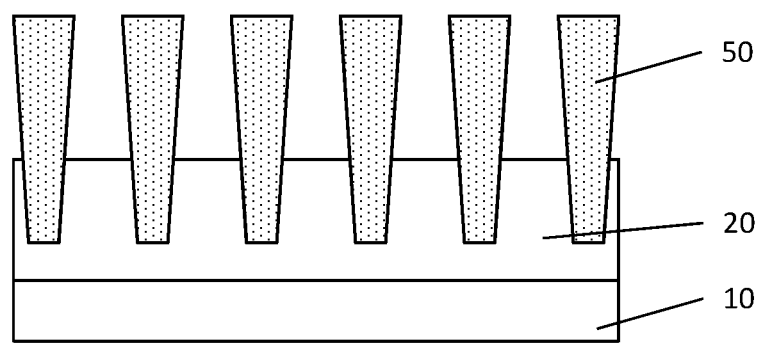

Then, as shown in FIG. 5, the etching stop layer 30 is removed. Dry etching and/or wet etching is applied to remove the etching stop layer 30. When the etching stop layer 30 is made of a nitride-based material (e.g., SiN) and the STI 50 is made of an oxide-based material, wet etching using $H_3PO_4$ can remove the etching stop layer 30 with a high etching selectivity against the STI layer 50 and the SiGe first semiconductor layer 20.

Figure 6:
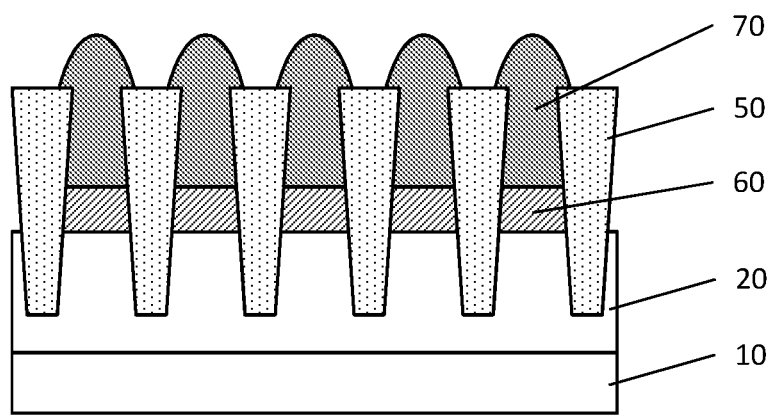

As shown in FIG. 6, after the etching stop layer 30 is removed and the surface of the first semiconductor layer 20 is exposed, a second semiconductor layer 60 is formed over the first semiconductor layer 20, followed by forming a third semiconductor layer 70 over the second semiconductor layer 60.

In one embodiment, the second semiconductor layer 60 is Si or a Si based compound semiconductor such as SiGe. When SiGe is used as the second semiconductor layer, a Ge content of the second semiconductor layer is smaller than that of the SiGe first semiconductor layer 20. In some embodiments, the Ge content (x in $Si_{1-x}Ge_x$) of the second semiconductor layer 60 is 0.1 or less. The second semiconductor layer 60 functions as a stressor region to apply stress to the channel region.

The second semiconductor layer 60 is epitaxially formed over the first semiconductor layer 20 in the spaces 45 formed by removing the dummy layer 40. The epitaxial growth of the Si or SiGe second semiconductor layer can be performed by using $SiH_4$ and/or $SiH_2Cl_2$ and/or $GeH_4$ as source gases at a temperature in a range from about 500° C. to about 700° C. and at a pressure in a range from about 10 to 100 Torr. The thickness of the second semiconductor layer 60 is in a range from about 10 nm to about 30 nm in some embodiments, or is in a range from about 13 nm to about 20 nm in other embodiments.

The third semiconductor layer 70 is made of Ge or a Ge-based semiconductor such as SiGe. When SiGe is used as the third semiconductor layer, a Ge content (x in $Si_{1-x}Ge_x$) of the third semiconductor layer is in a range from about 0.4 to about 0.8 in some embodiments.

The third semiconductor layer 70 is epitaxially formed over the second semiconductor layer 60 in the spaces 45 and over the STI layer 50. The epitaxial growth of the Si or SiGe third semiconductor layer can be performed by using $SiH_4$ and/or $SiH_2Cl_2$ and/or $GeH_4$ as source gases at a temperature in a range from about 500° C. to about 700° C. and at a pressure in a range from about 10 to 100 Torr.

Figure 7:
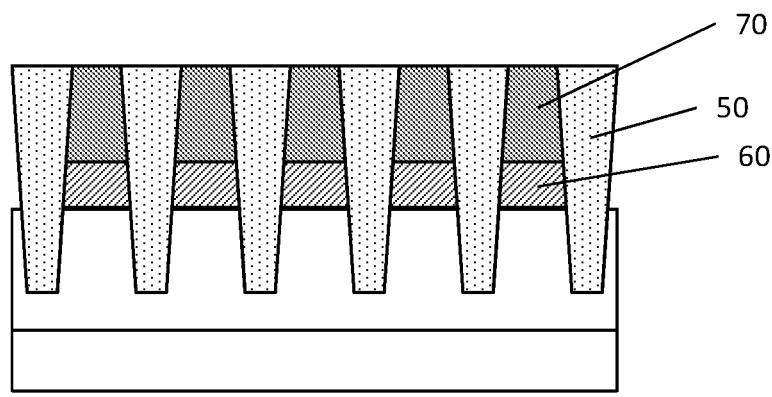

Further, a planarization operation such as CMP and/or an etch-back process is performed to remove a portion of the third semiconductor layer formed above the upper surface of the STI layer 50 to obtain the structure shown in FIG. 7.

Figure 8:
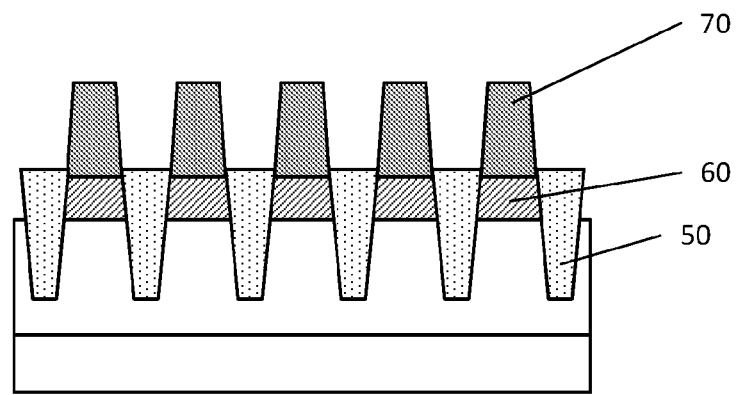

Next, as shown in FIG. 8, an upper portion of the third semiconductor layer is exposed by partially removing the STI layer 50, thereby obtaining a channel region of the Fin FET. An etch-back process can be employed to partially remove (recess) the STI layer 50. By adjusting etching time, a desired thickness of the remaining STI layer 50 can be obtained. In FIG. 8, the second semiconductor layer 60 is not exposed and is embedded in the STI layer 50. However, in some embodiments, an upper portion of the second semiconductor layer is slightly exposed above the STI layer 50.

Figure 9:
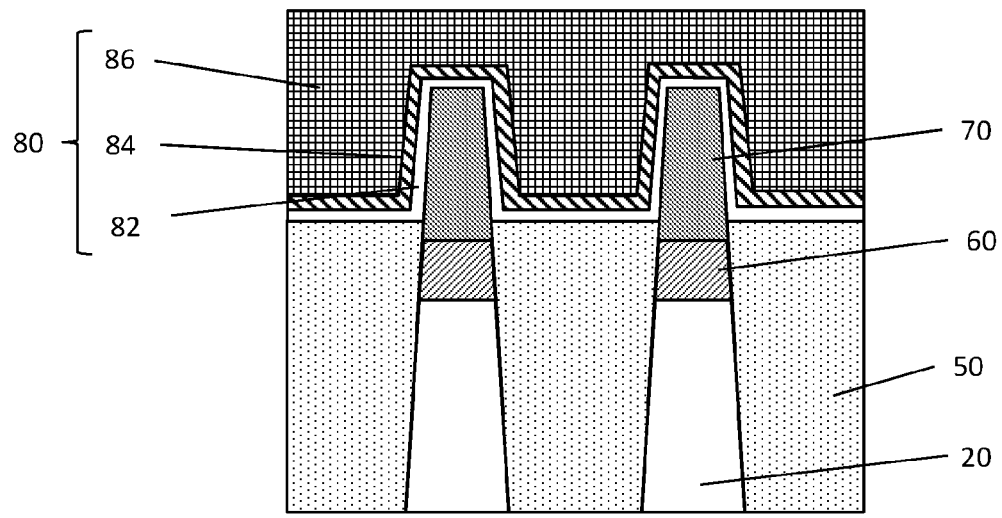

After partially exposing the upper portion of the third semiconductor layer, a gate structure 80 is formed over the exposed third semiconductor layer, as shown in FIG. 9. A gate dielectric material and a gate electrode material are formed over the STI layer 50 and the channel region (exposed third semiconductor layer), and then patterning operations are performed so as to obtain gate structure 80 including a gate electrode layer 86 and a gate dielectric layer 82. The gate electrode layer 86 is poly crystalline silicon in one embodiment. The patterning of the poly crystalline silicon layer is performed by using a hard mask including a silicon nitride layer and an oxide layer in some embodiments. The gate dielectric layer may be silicon oxide formed by CVD, PVD, ALD, e-beam evaporation, or other suitable process. The width of the gate structure 80 is in the range of about 30 nm to about 60 nm in some embodiments.

In certain embodiments, the gate dielectric layer 82 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode layer 86 includes one or more layer of conductive material, such as poly crystalline silicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-first or replacement gate (gate-last) methodology.

In certain embodiments, one or more work function adjustment layers 84 is interposed between the gate dielectric layer 82 and the gate electrode layer 86. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel Fin FET and the p-channel Fin FET which may use different metal layers.

Source and drain regions are also fabricated by using, for example, raised epitaxial structures with strain materials.

Figure 10:
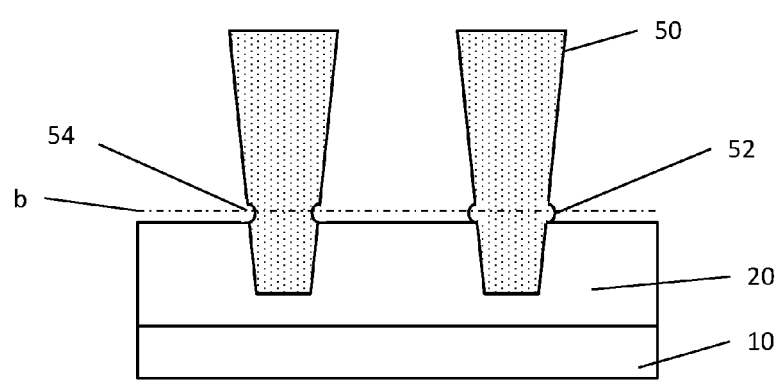
FIGS. 10 and 11 show exemplary cross sectional views of one of the processes for manufacturing the Fin FET device according to one embodiment of the present disclosure.

In the present embodiment, during the trench etching of the dummy layer 40, the etching stop layer 30 and the first semiconductor layer 20 to form STI layers 50 (see FIG. 3), depending on the etching condition and/or the material of the etching stop layer 30, the side walls of the trenches at the level of the etching stop layer 30 may become uneven. For example, if the etching stop layer 30 is etched more than the dummy layer 40 and the first semiconductor layer 20 during the trench etching, the trench may have a projection at the level b of the etching stop layer 30, thereby forming a projection 52 in the STI layer 50, as shown in FIG. 10. If the etching stop layer 30 is etched less than the dummy layer 40 and the first semiconductor layer 20 during the trench etching, the trench may have a recess at the level b of the etching stop layer 30, thereby forming a recess 54 in the STI layer 50, as shown in FIG. 10.

Figure 11:
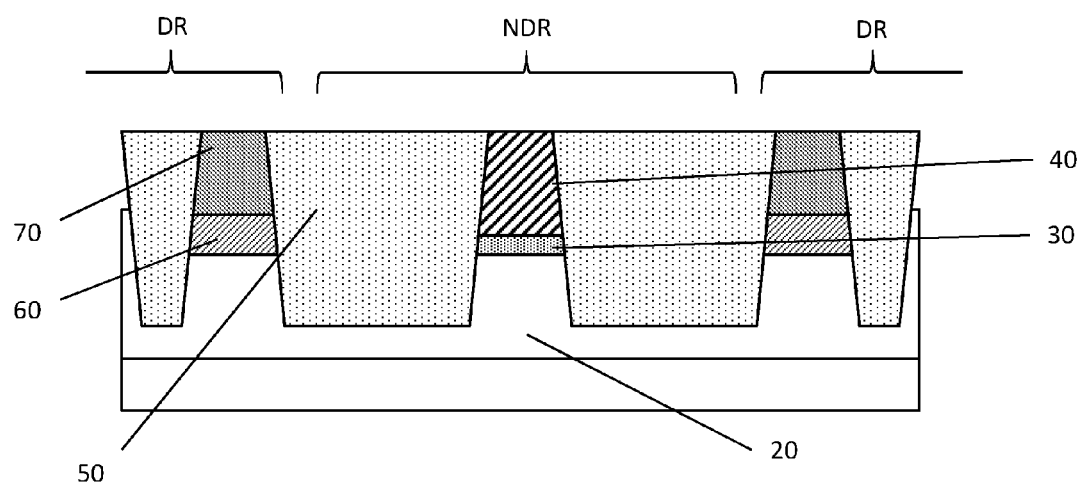

Further, FIGS. 2-9 generally describe a device area DR (see, FIG. 11) over the substrate, where active circuit elements including Fin FETs are formed. However, one or more non-device areas NDR (see, FIG. 11) are disposed over the substrate. The non-device areas do not include active circuit elements and may include areas between the device areas, scribe areas, or process monitoring areas. In such non-device areas, unlike FIGS. 4 and 5, the dummy layer 40 and the etching stop layer 30 may not necessarily be removed. In such a case, as shown in FIG. 11, the non-device area may include an area where the dummy layer 40 and the etching stop layer 30 remain over the first semiconductor layer. It is noted that the remaining the dummy layer 40 and the etching stop layer 30 (collectively dummy layers) may suppress, for example, a dishing problem during the CMP process for forming the STI layer 50.

It is understood that the Fin FETs may undergo further CMOS processes to form various features such as contacts/vias, interconnect metal layers, dielectric layers, passivation layers, etc.

The various embodiments or examples described herein offer several advantages over the existing art. For example, in the present disclosure, the etching stop layer 30 and the dummy layer 40 are formed over the first semiconductor layer 20, the trenches and STI layer 50 are formed, the dummy layer 40 and the etching stop layer 30 are removed, and then the second semiconductor layer 60 is formed with a desired thickness. With this operation, it is possible to precisely control the thickness of the second semiconductor layer with a high uniformity. The thickness uniformity (variation) of the second semiconductor layer is less than 5%.

It will be understood that not all advantages have been necessarily discussed herein, no particular advantage is required for all embodiments or examples, and other embodiments or examples may offer different advantages.

In accordance with one aspect of the present disclosure, a semiconductor device includes device areas in which active circuit elements including a fin field effect transistor (Fin FET) are disposed, and a non-device area which is disposed between the device areas or includes a scribe line and includes a dummy structure. The Fin FET includes a fin structure, an isolation region and a gate structure. The fin structure has a well region including a first semiconductor layer, a stressor region including a second semiconductor layer and a channel region including a third semiconductor layer. In the isolation region, the well region is embedded, and at least an upper port of the channel region is exposed from the isolation region. The gate structure is disposed over a part of the fin structure. The dummy structure in the non-device area includes a first dummy layer formed over the first semiconductor layer and made of a different material from the stressor region, and a second dummy layer formed over the first dummy layer and made of a different material from the channel region.

In accordance with another aspect of the present disclosure, a semiconductor device includes a first device area in which a first fin field effect transistor (Fin FET) is disposed, a second device area in which a second Fin FET is disposed, and a non-device area which is disposed between the first and second device areas and includes a dummy structure. Each of the first and second Fin FETs includes a fin structure, an isolation region and a gate structure. The fin structure has a well region including a first semiconductor layer, a stressor region including a second semiconductor layer and a channel region including a third semiconductor layer. In the isolation region, the well region is embedded, and at least an upper port of the channel region is exposed from the isolation region. The gate structure is disposed over a part of the fin structure. The dummy structure in the non-device area includes a first dummy layer formed over the first semiconductor layer and made of a different material from the stressor region, and a second dummy layer formed over the first dummy layer and made of a different material from the channel region.

In accordance with another aspect of the present disclosure, a semiconductor device includes two fin structures, an isolation region and a gate structure. Each of the two fin structures has a well region made of a first semiconductor material, a stressor region made of a second semiconductor material and a channel region made of a third semiconductor material. The well region is embedded in the isolation region, and at least an upper port of the channel region is exposed from the isolation region. The isolation region is disposed between the two fin structures. The gate structure is disposed over a part of the two fin structures. A side face of the isolation region has a protrusion protruding into the stressor region or a recess filled with the second semiconductor material.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a fin structure which has a first region made of a first semiconductor material, a second region made of a second semiconductor material different from the first semiconductor material, and a channel region made of a third semiconductor material different from the second semiconductor material;
an isolation region in which the first region and the second region are embedded, and from which at least an upper port of the channel region is exposed; and
a gate structure disposed over the channel region, wherein:
an interface between the second region and the first region is located below an upper surface of the isolation region,
the first semiconductor material includes a first Ge based semiconductor material,
the second semiconductor material includes a Si or a Si based semiconductor material,
the third semiconductor material includes a second Ge based semiconductor material, and
Ge contents of the first and second Ge based semiconductor materials are greater than a Ge content of the second semiconductor material.

2. The semiconductor device of claim 1, wherein an interface between the second region and the channel region is located below the upper surface of the isolation region.

3. The semiconductor device of claim 1, wherein a side face of the isolation region has a protrusion protruding into the second region.

4. The semiconductor device of claim 1, wherein a side face of the isolation region has a recess filled with the second semiconductor material.

5. The semiconductor device of claim 1, wherein the first Ge based semiconductor material is $Si_{1-x}Ge_x$, where x is in a range from 0.15 to 0.3.

6. The semiconductor device of claim 1, wherein the second semiconductor material includes $Si_{1-y}Ge_y$, where y is 0.1 or less.

7. The semiconductor device of claim 1, wherein the second Ge based semiconductor material is $Si_{1-z}Ge_z$, where z is in a range from 0.4 to 0.8.

8. The semiconductor device of claim 1, wherein a thickness of the second region is smaller than a thickness of the channel region and a thickness of the first region.

9. The semiconductor device of claim 8, wherein a thickness of the second region is in a range from 10 nm to 30 nm.

10. The semiconductor device of claim 1, wherein an entirety of the fin structure has a tapered shape.

11. A semiconductor device, comprising:
a first fin structure which has a first region made of a first material, a second region disposed over the first region and made of a second material different from the first material, and a third region disposed over the second region and made of a third material different from the second material;
a second fin structure which has a fourth region made of a fourth material, a fifth region disposed over the fourth region and made of a fifth material different from the fourth material, and a sixth region disposed over the fifth region and made of a sixth material different from the fifth material; and
an isolation region in which the first region, the second, the fourth and the fifth regions are embedded, wherein:
the first material is the same as the fourth material, and the second material is different from the fifth material.

12. The semiconductor device of claim 11, wherein the third material is different from the sixth material.

13. The semiconductor device of claim 11, wherein the first and second fin structures have a tapered shape.

14. The semiconductor device of claim 11, wherein a thickness the second region is different from a thickness of the fifth region.

15. The semiconductor device of claim 14, wherein the thickness the second region is greater than the thickness of the fifth region.

16. The semiconductor device of claim 11, wherein a thickness the third region is different from a thickness of the sixth region.

17. The semiconductor device of claim 16, wherein the thickness the third region is smaller than the thickness of the sixth region.

18. A semiconductor device, comprising:
fin structures, each of which has a first region protruding from a substrate and made of a first semiconductor material, a second region made of a second semiconductor material, and a channel region made of a third semiconductor material different from the second semiconductor material; and
an isolation region in which the first region and the second region are embedded, and from which at least an upper port of the channel region is exposed; and
a gate structure disposed over the channel region of each of the fin structures, wherein:
an interface between the second region and the first region is located below an upper surface of the isolation region, and
a side face of the isolation region has one of a protrusion protruding into the second region and a recess filled with the second semiconductor material.

19. The semiconductor device of claim 1, wherein:
the gate structure includes a gate dielectric layer and a gate electrode layer, and
the gate dielectric layer includes a first portion disposed on a side face of the channel region and a second portion laterally extending from a bottom of the first portion and disposed on an upper surface of the isolation region.

20. The semiconductor device of claim 18, wherein:
the gate structure includes a gate dielectric layer and a gate electrode layer, and
the gate dielectric layer includes a first portion disposed on a side face of the channel region of one of the fin structure, a second portion disposed on a side face of the channel region of adjacent one of the fin structure and a third portion connecting a bottom of the first portion and a bottom of the second portion and disposed on an upper surface of the isolation region.

* * * * *